United States Patent [19]

Oxner

[11] Patent Number: 4,637,490

[45] Date of Patent: Jan. 20, 1987

[54] JELLYFISH ARRAY

[75] Inventor: Clifford F. J. Oxner, Halifax, Canada

[73] Assignee: Her Majesty the Queen in Right of Canada, Ottawa, Canada

[21] Appl. No.: 785,539

[22] Filed: Oct. 8, 1985

[30] Foreign Application Priority Data

Apr. 11, 1985 [CA] Canada .................................. 478941

[51] Int. Cl.⁴ ........................ G10K 11/00; H05K 5/00

[52] U.S. Cl. .................................... 181/175; 181/144; 181/147; 367/154

[58] Field of Search ........................ 181/144, 147, 175; 367/117, 153–156, 177, 188

[56] References Cited

U.S. PATENT DOCUMENTS

| | | | |
|---|---|---|---|
| 3,277,433 | 10/1966 | Toulis | 367/155 |
| 3,372,368 | 3/1968 | Dale et al. | 367/154 X |
| 3,800,271 | 3/1974 | Stillman, Jr. | 367/4 |
| 4,277,839 | 7/1981 | McKinney | 367/155 |

*Primary Examiner*—Benjamin R. Fuller
*Attorney, Agent, or Firm*—Stevens, Davis, Miller & Mosher

[57] ABSTRACT

The application describes a "jellyfish" acoustic array. The array is housed in a cable suspended container with an open bottom. A series of individual transducer elements are stacked inside the container, and may be deployed in a column hanging from the container. Spacer cables join adjacent transducer elements to limit the separation of the deployed elements. The uppermost of the transducer elements is suspended from the container. Control cables secured to the bottommost of the transducer elements and extend up through the container. Pulling in the control cables raises the bottommost transducer element and sequentially stacks the remaining transducer elements. Lowering the control cables serves to deploy the transducers.

9 Claims, 6 Drawing Figures

JELLYFISH ARRAY

FIELD OF THE INVENTION

The present invention relates to acoustic arrays and more particularly to large vertical underwater acoustic arrays.

BACKGROUND

The use of large vertical underwater acoustic arrays presents several handling problems. In a vertical array, the length of the array usually exceeds the height of the crane or "A" frame that is used to handle the array. Consequently, deployment of the array is usually accomplished by lowering first the bottom section, tying it off, taking a new purchase and repeating this procedure until the full length of the array is deployed. Retrieval is accomplished in the reverse order. Both of these operations are time consuming, awkward and require a large storage space. Further, while in the deployed state the array has a large dynamic mass and high drag. While this is desirable for the stability of the deployed system, it requires a slow deployment and recovery and massive handling gear in order to carry the load. The term "dynamic mass" is used to denote the apparent mass of a body moving in a fluid. This is higher than the actual mass of the body due to the mass of fluid that moves with the body.

SUMMARY

The present invention seeks to provide a large vertical underwater acoustic array that has the desired high dynamic mass and drag in a deployed state but that can be deployed and recovered relatively quickly with relatively simple handling gear.

According to the present invention there is provided an acoustic array comprising:

a container with an open botton;

means for suspending the container;

a plurality of transducer elements positionable in a stowed condition wherein the elements are stacked inside the container, and a deployed condition in which the elements are spaced apart in a column depending from the container;

spacer means joining each adjacent pair of transducer elements to limit the separation of the adjacent elements in the deployed condition and joining the uppermost of the transducer elements to the container to limit the separation of the uppermost transducer element from the container; and control means secured to the bottommost of the transducer elements and extending therefrom for raising and lowering the bottommost transducer element between its stacked and deployed conditions while sequentially stacking or deploying the remaining transducer elements.

Such an arrangement permits rapid deployment of long vertical arrays ("jellyfish" arrays) in air or water from a ship, barge, buoy, submarine, helicopter or other platform. When stowed within the container, the array has a low dynamic mass and low drag. The stowed array can be lowered to the necessary location using conventional winching facilities and then the transducers may be deployed through the use of the control means.

In preferred embodiments of the invention, the container is a short cylindrical canister that exhibits a relatively low drag and protects the array during handling. The control means are a number of control cables attached at their lower ends to the bottommost element of the array and free to slide through guides in the remaining elements and through holes in each of several stacking discs. The upper ends of the control cables are connected to a single deploy cable through a yoke. The bottommost element of the array is weighted to assist deployment and vertical stability of the array. It may not be an active transducer element, but a weighted dummy transducer element or a weight. The spacer means are fixed spacer cables attached to the transducer elements and the stacking discs. Elastic bands or "bungy cords" are placed between each element and the adjacent stacking discs, and between pairs of adjacent stacking discs, around the fixed spacer cables and electric cables to the transducer elements. The elastic bands provide a method of folding the spacer cables and electrical cables without tangling them during recovery of the array. In the stowed array, the stacked elements are held away from each other by spacers to allow storage space for the cables.

In a more expensive but otherwise more advantageous alternative embodiment, the deploy cable and yoke are omitted and the control cables are connected to a winch contained within the upper part of the canister. The winch is powered via the main electrical cable to the array.

BRIEF DESCRIPTION OF THE DRAWINGS

In the accompanying drawings which illustrate exemplary embodiments of the present invention.

DETAILED DESCRIPTION

Figure 1:
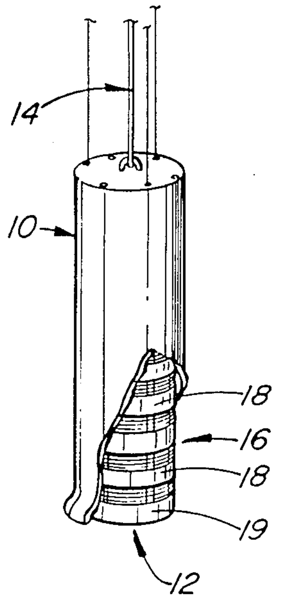
FIG. 1 is a perspective view of an array according to the invention in a stowed condition, with part of the canister broken away.
Figure 2:
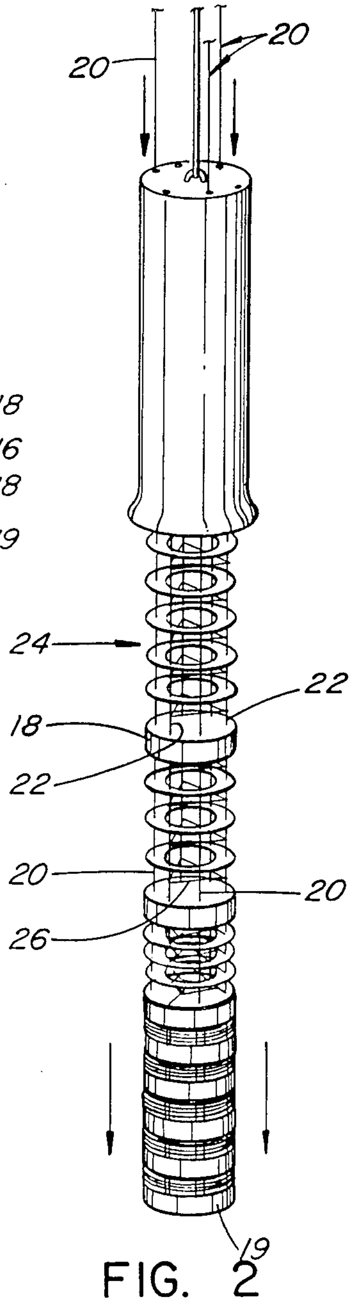
FIG. 2 is a view of the array of FIG. 1, showing the array partially deployed.
Figure 3:
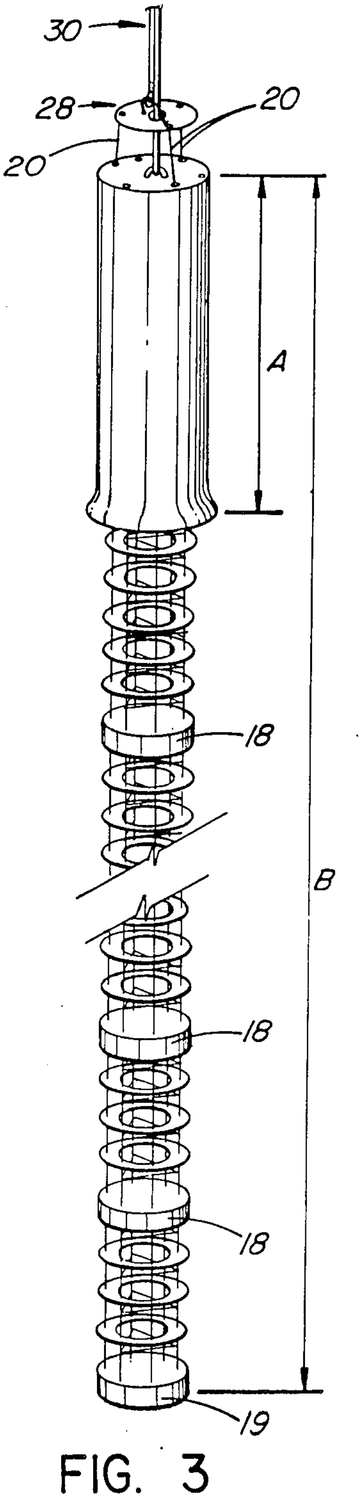
FIG. 3 is a view like FIG. 2 showing the array fully deployed.

Referring to the drawings, and particularly to FIGS. 1, 2 and 3, there is illustrated a large, vertical, underwater, "jellyfish" acoustic array. The array includes a cylindrical canister 10 with a slightly belled open mouth 12 at the bottom end. The canister 10 is suspended by a main cable 14 that serves for raising and lowering of the array as a unit.

Canister 10 contains a stacked array 16 of acoustic transducers 18 and 19. The bottommost transducer element 19 is weighted to assist in the deployment of the array from the canister. In some embodiments, element 19 may be a dummy element. Three control cables 20 are connected to the bottommost transducer element 19. They are free to slide through appropriate guides in the remaining transducer elements 18 and in the top of the cannister 10. To limit the separation of the elements when deployed, adjacent transducer elements 18 are connected by fixed length spacer cables 22. The uppermost transducer element is also suspended from the top of the canister 10 by cables 22. Several stacking discs 24 are located between the uppermost transducer 18 and the container 10, and between each adjacent pair of transducer elements 18. These discs are secured to the fixed spacer cables 22 at fixed intervals and have holes 23 to allow the cables 20 run freely through the discs. Elastic bands 26 are arranged between each adjacent pair of stacking discs 24 and between the stacking discs and the transducer elements 18 and 19. As illustrated in the upper part of FIG. 2 and in FIG. 3, the elastic bands are stretched around the spacer cables 22 in the deployed condition of the array. As the array approaches a stowed condition, the elastic bands contract to draw the spacer cable into the spaces between the discs to stow the cables appropriately between the discs without tangling or interference.

As illustrated in FIG. 3, the control cables 20 are all connected to a yoke 28, which is in turn fastened to a deploy cable 30.

In order to deploy the array from the stowed condition illustrated in FIG. 1, the deploy cable 30 is payed out from a conventional winch, thus lowering the control cables 20 due to the weight of the lowermost transducer element 19. As the stacked array descends, the spacer cables 22 between the uppermost element and the canister 10 become taut. The remaining transducer elements descend with the element 19 until the next length of spacer cables 22 is taut and so on in sequence until the transducer elements are deployed at the desired spacings as illustrated in FIG. 3. Movement from the deployed condition to the stowed condition is carried out in the reverse order. In typical emodiments of the invention, the canister will be 2 to 2½ feet in diameter and will have a length A (FIG. 3) of 6 to 8 feet. The length of the deployed array will be in the order of 75 feet.

Figure 4:
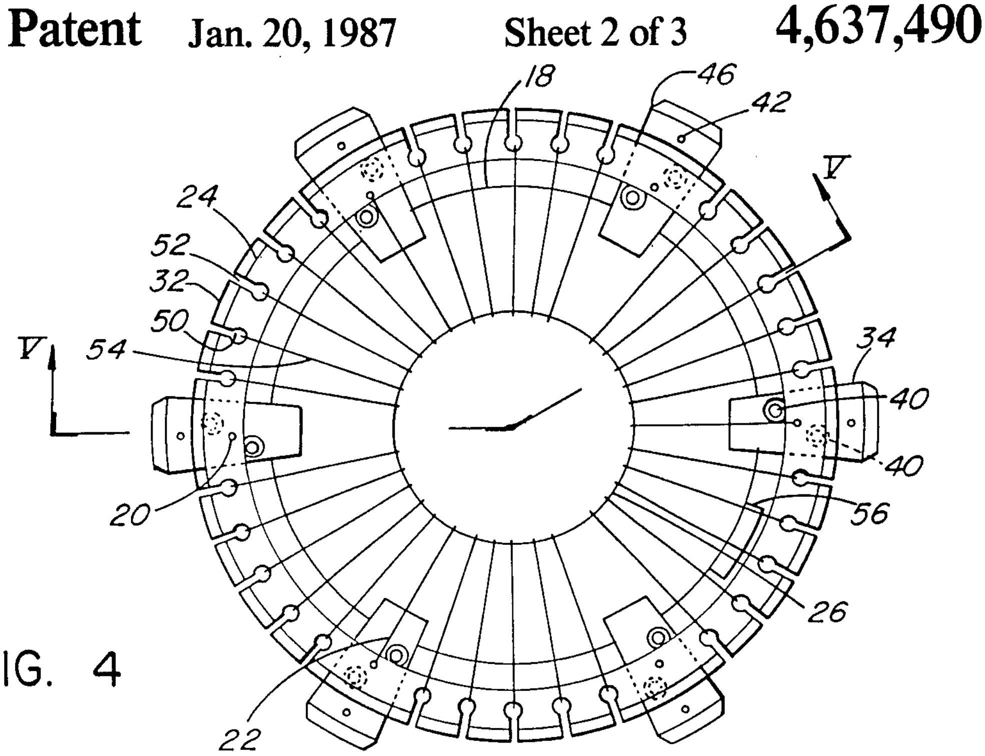
FIG. 4 is a sectional view of an alternative embodiment of the invention in the stowed condition.
Figure 5:
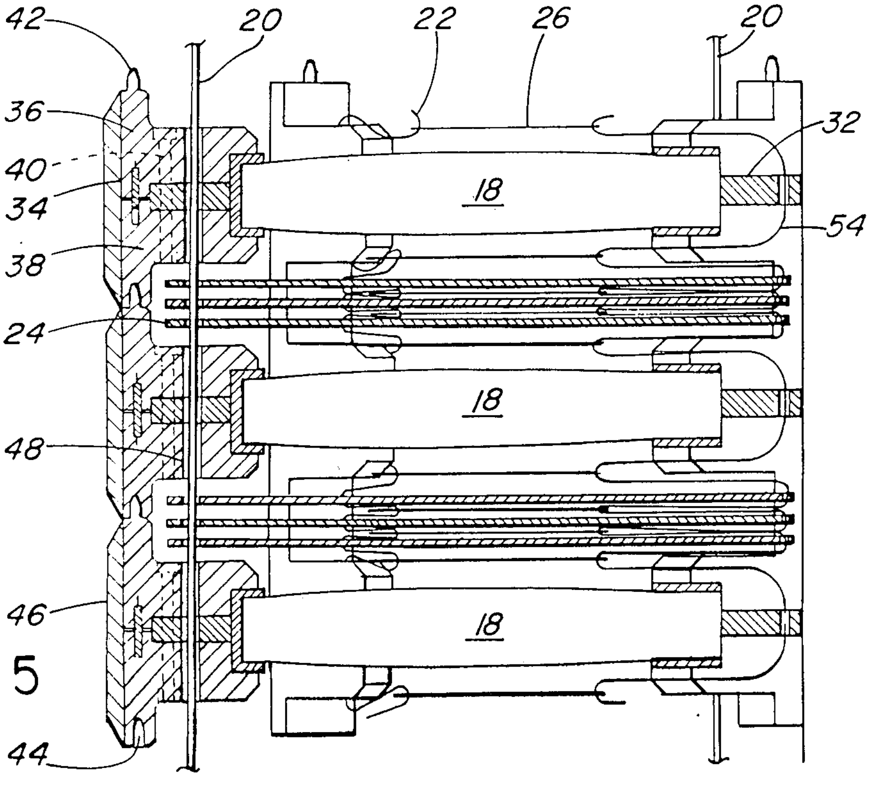
FIG. 5 is a view along line V—V of FIG. 4.
Figure 6:
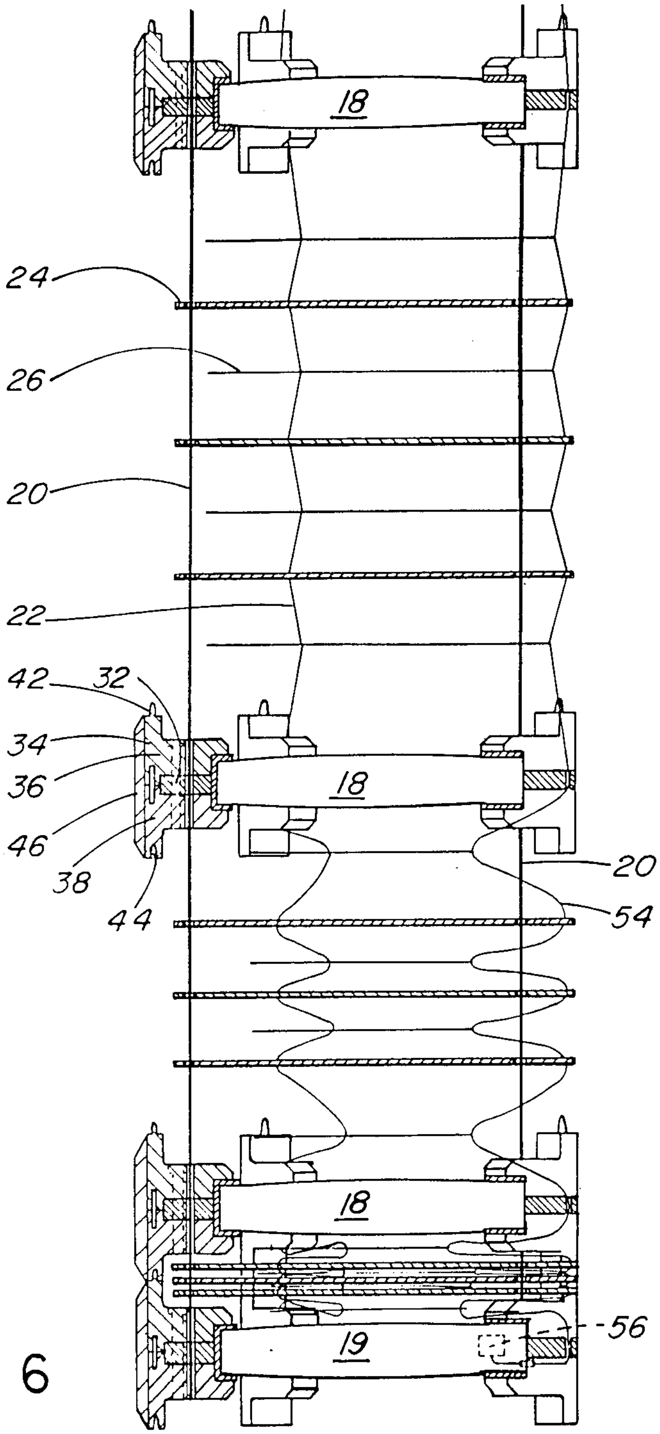
FIG. 6 is a view like FIG. 5 showing the array partially deployed.

Turning now to FIGS. 4, 5 and 6, there is illustrated in somewhat more detail the transducer assembly of another embodiment of the array. For the sake of consistency and clarity, the same reference numerals have been applied to elements common with the FIGS. 1, 2 and 3 embodiment.

In the embodiment shown in FIGS. 4, 5 and 6, each transducer element 18 and 19 is equipped with a mounting ring 32 that is secured to the periphery of the element. Six securing clamps 34 are fixed to the mounting ring of each transducer element at positions spaced uniformly about the ring. Each clamp has two parts 36 and 38 fixed to opposite sides of the mounting ring 32 with a pair of screws 40. The upper part 36 of each securing clamp has a tapered pin 42 projecting from its top face for engagement with a complementary alignment socket 44 in the bottom face of the bottom part 38 of the adjacent securing clamp.

As illustrated most particularly in FIG. 5, the securing clamps are configured such that when the array is properly stowed with the alignment pins 42 nesting in the alignment sockets 44, there is a space between adjacent transducer elements 18 to acommodate the stacking discs 24, the stowed cables and the elastic bands. Each securing clamp is also equipped with a plastic runner 46 on its outer face to guide the transducer element properly into the canister 10.

Three of the securing clamps 34 are equipped with control cable passages 48 through which the control cables 20 may run freely. These clamps are spaced alternately around the mounting ring. The other three clamps are fixed to the spacer cables 22 for limiting the separation of the transducer elements in the fully deployed condition.

As illustrated most particularly in FIG. 4, each stacking disc 24 has a series of notches 50 in its periphery. Similar notches 52, aligned with the notches 50 are found in the periphery of each mounting ring 32. These notches acommodate the various electrical service cables 54 that are connected to the transducer elements 18 and 19. FIGS. 4 and 6 illustrate bosses 56 which serves for the connection of cables 54 to transducer elements 18 and 19. As illustrated in FIGS. 4, 5 and 6, the electrical cables and the spacer cables 22 are constrained by elastic bands 26 to fold in an orderly manner into the space between adjacent transducer elements when the array is in a stowed condition. For the sake of clarity, FIGS. 5 and 6 illustrate only two control cables 20, a single spacer cable 22 and a single electrical cable 54.

In the embodiment illustrated in FIGS. 4, 5 and 6 electrical cables are included at the top of the array. This number diminishes towards the lower end of the array as more elements are connected.

While two embodiments of the invention have been described in the foregoing, with particular reference to an underwater sonar array, it is to be understood that other embodiments are possible. For example arrays for deployment in the air and with electromagnetic radiation sensors are possible. The scope of the invention is therefore not limited to the illustrated and described embodiments.

I claim:

1. An acoustic array comprising:

a container with an open bottom;

means for suspending the container;

a plurality of transducer elements positionable in a stowed condition wherein the elements are stacked inside the container, and a deployed condition in which the elements are spaced apart in a column depending from the container;

spacer means joining each adjacent pair of transducer elements to limit the separation of the adjacent elements in the deployed condition and joining the uppermost of the transducer elements to the container to limit the separation of the uppermost transducer element from the container; and control means secured to the bottommost of the transducer elements and extending therefrom for raising and lowering the bottom most transducer element between its stacked and deployed conditions while sequentially stacking or deploying the remaining transducer elements.

2. An array according to claim 1, wherein the spacer means comprise a plurality of flexible spacer lines joining each pair of adjacent transducer elements.

3. An array according to claim 2, wherein the spacer means include resilient means for drawing the spacer lines together between the transducer elements during movement of the array to its stowed condition.

4. An array according to claim 3, with electrical cables extending from the container to the transducer elements, the electrical cables being engaged by said resilient means so as to be drawn together between the transducer elements during movement of the array to its stowed condition.

5. An array according to claim 2, including a plurality of stacking elements between adjacent transducer elements and an elastic band encompassing the spacer lines between each pair of adjacent stacking elements and between each transducer element and the adjacent stacking element, the elastic bands being stretched in the deployed condition of the array and drawing the spacer lines towards one another on stacking of the array.

6. An array according to claim 5 with electrical cables extending from the container to the transducer elements, and engaged by the elastic bands for folding the electrical cables during movement of the array to its stowed condition.

7. An array according to claim 1, including alignment means secured to each transducer element for engaging the alignment means of each adjacent transducer element to retain the adjacent transducer elements in alignment in the stowed condition of the array.

8. An array according to claim 7; wherein the alignment means comprise transducer securing clamps secured at spaced locations to the periphery of each transducer.

9. An array according to claim 8, wherein each clamp carries a runner element on its outermost surface for engaging the container and guiding the associated transducer element into the container during stacking of the array.

* * * * *